(12) United States Patent
O'Meara et al.

(10) Patent No.: US 8,673,725 B2
(45) Date of Patent: Mar. 18, 2014

(54) MULTILAYER SIDEWALL SPACER FOR SEAM PROTECTION OF A PATTERNED STRUCTURE

(75) Inventors: David L. O'Meara, Poughkeepsie, NY (US); Anthony Dip, Cedar Creek, TX (US); Aelan Mosden, Poughkeepsie, NY (US); Pao-Hwa Chou, Kofu (JP); Richard A Conti, Katonah, NY (US)

(73) Assignees: Tokyo Electron Limited, Tokyo (JP); International Business Machines Corporation, Armonk, NY (US)

( * ) Notice: Subject to any disclaimer, the term of this patent is extended or adjusted under 35 U.S.C. 154(b) by 688 days.

(21) Appl. No.: 12/751,926

(22) Filed: Mar. 31, 2010

(65) Prior Publication Data

US 2011/0241128 A1     Oct. 6, 2011

(51) Int. Cl.
*H01L 29/78* (2006.01)

(52) U.S. Cl.
USPC .... 438/303; 438/598; 257/900; 257/E21.626; 257/E21.64

(58) Field of Classification Search
USPC .......... 438/230, 303, 595, 598; 257/E21.626, 257/E21.64, 900
See application file for complete search history.

(56) References Cited

U.S. PATENT DOCUMENTS

| | | | | |
|---|---|---|---|---|
| 6,194,310 B1 * | 2/2001 | Hsu et al. | ....................... | 438/643 |
| 6,319,775 B1 * | 11/2001 | Halliyal et al. | ............... | 438/261 |
| 6,991,991 B2 * | 1/2006 | Cheng et al. | ................... | 438/303 |
| 7,202,187 B2 | 4/2007 | Ramachandran et al. | | |
| 7,397,073 B2 | 7/2008 | Engel et al. | | |
| 7,420,240 B2 | 9/2008 | Rudeck | | |
| 2002/0068398 A1 | 6/2002 | Dong et al. | | |
| 2006/0094192 A1 * | 5/2006 | Yang et al. | ..................... | 438/287 |
| 2006/0286817 A1 * | 12/2006 | Kato et al. | ..................... | 438/791 |
| 2007/0252221 A1 | 11/2007 | Ohta | | |
| 2008/0054356 A1 * | 3/2008 | Yoshida | ........................ | 257/344 |
| 2011/0163357 A1 * | 7/2011 | Tan et al. | ...................... | 257/288 |

OTHER PUBLICATIONS

X. L. Xu et al, "Characterization of Thin Silicon Oxynitride Films Prepared by Low Pressure Rapid Thermal Chemical Vapor Deposition", Oct. 1993, J. Electrochem Soc., vol. 140, No. 10, pp. 2970-2974.*

U.S. Appl. No. 12/751,891 entitled "Dual Sidewall Spacer for Seam Protection of a Patterned Structure," First Named Inventor: David L. O'Meara, filed Mar. 31, 2010.

United States Patent and Trademark Office, Non-final Office Action in related U.S. Appl. No. 12/751,891, mailed Jan. 14, 2013, 15pages.

* cited by examiner

*Primary Examiner* — Daniel Whalen
*Assistant Examiner* — Suberr Chi

(57) ABSTRACT

A semiconducting device with a multilayer sidewall spacer and method of forming are described. In one embodiment, the method includes providing a substrate containing a patterned structure on a surface of the substrate and depositing a first spacer layer over the patterned structure at a first substrate temperature, where the first spacer layer contains a first material. The method further includes depositing a second spacer layer over the patterned substrate at a second substrate temperature that is different from the first substrate temperature, where the first and second materials contain the same chemical elements, and the depositing steps are performed in any order. The first and second spacer layers are then etched to form the multilayer sidewall spacer on the patterned structure.

12 Claims, 7 Drawing Sheets

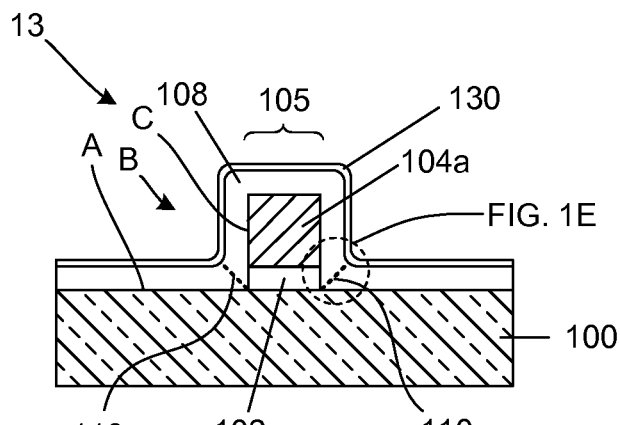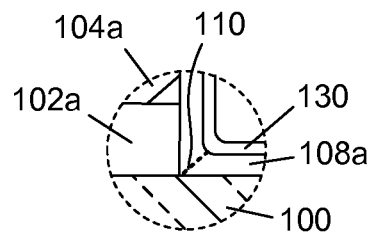
FIG. 1D
FIG. 1E
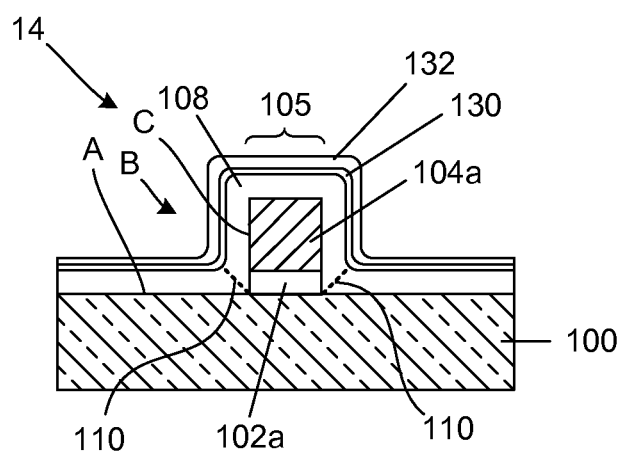
FIG. 1F
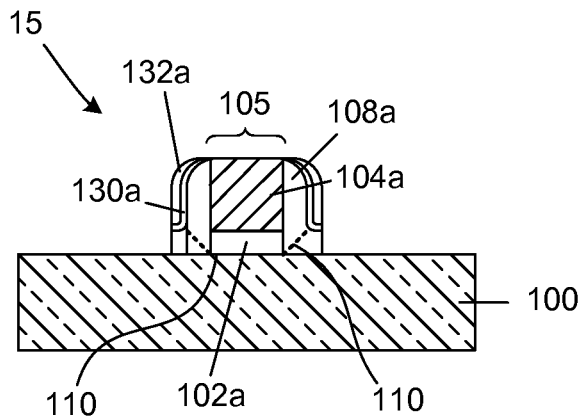
FIG. 1G

MULTILAYER SIDEWALL SPACER FOR SEAM PROTECTION OF A PATTERNED STRUCTURE

CROSS-REFERENCE TO RELATED APPLICATION

The present invention is related to U.S. patent application Ser. No. 12/751,891, entitled "DUAL SIDEWALL SPACER FOR SEAM PROTECTION OF A PATTERNED STRUCTURE", filed on even date herewith. The entire content of this application is incorporated herein by reference.

FIELD OF INVENTION

The present invention relates to semiconductor structures and devices having enhanced resistance to shorting and contaminant transfer, and more particularly to metal oxide semiconductor field effect transistors (MOSFETS), in which electrical shorting and contaminant transfer between the gate stack and surrounding regions is substantially eliminated.

BACKGROUND OF THE INVENTION

Field effect transistors (FETs) are the basic building block of today's integrated circuits (ICs). Such transistors can be formed in conventional substrates (such as silicon) or in silicon-on-insulator (SOI) substrates. State of the art MOS transistors are fabricated by depositing a gate stack material over a gate dielectric and a substrate. Generally, the MOS transistor fabrication process implements lithography and etching processes to define the conductive, e.g., poly silicon (poly Si), Si, gate structures. Source/drain extensions are formed by implantation, in which the implant is performed using a spacer to create a specific distance between the gate and the implanted junction. In some instances, such as in the manufacture of an NFET device, the source/drain extensions for the NFET device are implanted with no spacer. For a PFET device, the source/drain extensions are typically implanted with a spacer present. A thicker spacer is typically formed after the source/drain extensions have been implanted. Deep source/drain implants are then performed with the thick spacer present. High temperature anneals are performed to activate the junctions after which the source and drain regions and the top portion of the gate are silicided. Silicide formation typically requires that a refractory metal be deposited on the silicon wafer followed by a high temperature thermal anneal process to produce the silicide material. The structure is then passivated by a blanket-deposited conformal dielectric material.

In order to be able to make ICs, such as memory, logic, and other devices, of higher integration density than currently feasible, one has to find a way to further downscale the dimensions of field effect transistors (FETs), such as metal oxide semiconductors. The downscaling of transistor dimensions allows for improved performance as well as compactness, but such downscaling has some device degrading effects.

Further scaling of semiconducting devices requires that the electrical leakage and contamination transfer pathways through seams present in a conventional spacers be interrupted to ensure that the electrical pathways and contaminant transfer pathways between the gate conductor and the contacts to the source and drain region of the device be severed.

SUMMARY OF THE INVENTION

Embodiments of the invention provide a semiconducting patterned structure and method of forming. The patterned structure contains a multilayer sidewall spacer structure in which a discontinuous electrical pathway and a discontinuous contaminant transfer pathway through the multilayer sidewall spacer structure is provided.

According to one embodiment of the invention, the method includes providing a substrate containing a patterned structure on a surface of the substrate, depositing a first spacer layer over the patterned structure, where the first spacer layer contains a first material and has a seam propagating through a thickness of the first spacer layer near an interface region of the surface of the substrate and a sidewall of the patterned structure. The method further includes depositing a second spacer layer on the first spacer layer, where the second spacer layer is seam-free on the seam of the first spacer layer and contains a second material having different chemical elements than the first material, and etching the spacer layers to form the multilayer sidewall spacer on the patterned structure. In one embodiment, the method further includes depositing a third spacer layer containing a third material on the second spacer layer, According to another embodiment, a semiconducting device with a multilayer spacer is provided. The device includes a substrate containing a patterned structure on a surface of the substrate, a first spacer coating a sidewall of the patterned structure and containing a first material having a seam propagating through a thickness of the first spacer in an interface region formed by the surface of the substrate and the sidewall of the patterned structure, a second spacer on the first spacer, where the second spacer layer is seam-free on the seam of the first spacer layer and contains a second material having different chemical elements than the first material. In one embodiment, the device further includes a third spacer containing a third material on the second spacer.

According to yet another embodiment, the method includes providing a substrate containing the patterned structure on a surface of the substrate, depositing a first spacer layer over the patterned structure at a first substrate temperature, where the first spacer layer contains a first material. The method further includes depositing a second spacer layer over the patterned substrate at a second substrate temperature that is different from the first substrate temperature, where the first and second materials contain the same chemical elements, and where the depositing steps are performed in any order, and etching the first and second spacer layers to form the multilayer sidewall spacer on the patterned structure.

According to still another embodiment, a semiconducting device with a multilayer spacer is provided. The device includes a substrate containing a patterned structure on a surface of the substrate, a first spacer coating a sidewall of the patterned structure and containing a first material, and a second spacer coating a sidewall of the patterned structure and containing a second material, wherein the first and second materials are deposited at different substrate temperatures and contain the same chemical elements.

BRIEF DESCRIPTION OF THE DRAWINGS

FIGS. 1A-1J are pictorial representations (through cross-sectional views) showing basic processing steps that may be employed to produce a semiconducting patterned structure according to an embodiment of the invention;

DETAILED DESCRIPTION OF SEVERAL EMBODIMENTS OF THE INVENTION

Figure 1A:
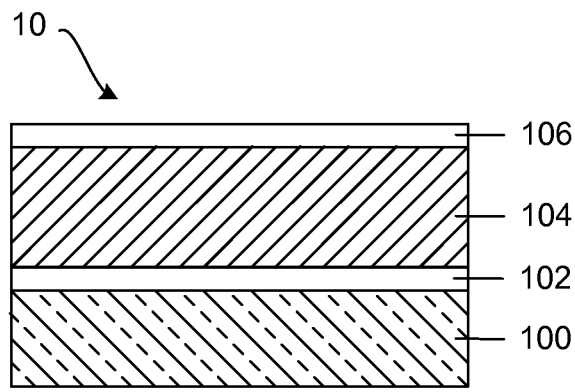

Embodiments of the invention provide a semiconducting patterned structure and method of forming. The semiconducting structure has a multilayer spacer structure for seam protection of the semiconducting structure, for example a gate stack of a field effect transistor. In general, the multilayer spacer structure may be used for various 3D structures used in electronic devices. It is noted that the drawings of the present application are provided for illustrative purposes and thus they are not drawn to scale. In particular, the dimensions of the seams and their relative position to each other have been enlarged to exemplify embodiments of the present invention.

In the accompanying drawings, like and/or corresponding elements are referred to by like reference numbers. In the drawings, an exemplary single gate stack (region) is shown and described. Despite this illustration, embodiments of the present invention are not limited to a structure including a single gate stack. Instead, a plurality of such gate stacks is contemplated.

FIGS. 1A-1J are pictorial representations (through cross-sectional views) showing basic processing steps that may be employed to produce a semiconducting patterned structure according to an embodiment of the invention. FIG. 1A shows a film structure 10 containing gate stack layers 102-106 provided atop a substrate 100. Forming of the film structure 10 can include depositing a gate dielectric layer 102 on the substrate 100, depositing a gate conductor layer 104 on the gate dielectric layer 102, and depositing a gate cap layer 106 on the gate conductor layer 104. In another example, the gate cap layer 106 may be omitted. One or more of these layers may be formed on the substrate 100 using deposition methods such as chemical vapor deposition (CVD), atomic layer deposition (ALD), or variants thereof.

The substrate 100 includes, but is not limited to: any semiconducting material such as Si-containing materials, GaAs, InAs and other like semiconductors. Si-containing materials include, but are not limited to: Si, bulk Si, single crystal Si, poly Si, SiGe, amorphous Si, silicon-on-insulator substrates (SOI), SiGe-on-insulator (SGOI), strained-silicon-on-insulator, annealed poly Si, and poly Si line structures.

When the substrate 100 is a silicon-on-insulator (SOI) or SiGe-on-insulator (SGOI) substrate, the thickness of the Si-containing layer atop the buried insulating layer typically can have a thickness on the order of 10 nm or greater. The SOI or SGOI substrate may be fabricated using techniques that are well known to those skilled in the art. For example, the SOI or SGOI substrate may be fabricated using a thermal bonding process, or alternatively by an ion implantation process, which is referred to in the art as separation by ion implantation of oxygen (SIMOX).

Still referring to FIG. 1A, the gate dielectric layer 102, formed atop the substrate 100, is typically an oxide or oxygen-based material. The gate dielectric layer 102 may also be composed of a nitride, oxynitride, or a combination thereof. The gate dielectric layer 102 may be formed using a deposition technique such as CVD, ALD, atomic layer CVD (ALCVD), pulsed CVD, plasma assisted CVD (PACVD), sputtering, and chemical solution deposition, or alternatively, the gate dielectric layer 102 may formed by a thermal growing process, which may include oxidation, oxynitridation, nitridation, and/or plasma or radical treatment. Suitable examples of oxides that can be employed as the gate dielectric layer 102 include, but are not limited to: $SiO_2$, $Al_2O_3$, $ZrO_2$, $HfO_2$, $Ta_2O_3$, $TiO_2$, perovskite-type oxides and combinations and multi-layers thereof. In some examples, the material of the gate dielectric layer 102 may be doped with metals to achieve the desired workfunction.

The gate conductor layer 104 is comprised of a conductive material such as poly silicon or an appropriate metal or metal compounds. The gate conductor layer 104 may be formed atop the gate dielectric layer 102 utilizing a deposition process such as CVD, ALD, ALCVD, pulsed CVD, PACVD, or sputtering. According to one embodiment, the gate conductor layer 104 may comprise doped poly silicon. The poly silicon dopant can be elements from Group III-A or an element from Group V of the Periodic Table of Elements. The dopant may be introduced during deposition of the gate conductor layer 104 after or following subsequent patterning and etching of the gate conductor layer 104. Alternately, the gate conductor layer 104 may comprise a metal (for example, W, Ir, Re, Ru, Ti, Ta, Mo, Nb, Ni, or Al), a metal silicide, a metal nitride, a metal oxide, or other conductive materials.

Still referring to FIG. 1A, the gate cap layer 106 may comprise a dielectric that can be deposited by CVD and related methods. Typically, the composition of gate cap layer 106 may include silicon oxides, silicon carbides, silicon nitrides, silicon carbonitrides, etc. Spin-on dielectrics may also be utilized as the gate cap layer 106 including, but not limited to: silsesquioxanes, siloxanes, and boron phosphate silicate glass (BPSG). The gate cap layer 106 may be patterned using photolithography and etching. Specifically, a pattern is produced by applying a photoresist to the surface to be patterned, exposing the photoresist to a pattern of radiation, and then developing the pattern into the photoresist utilizing a conventional resist developer.

Figure 1B:
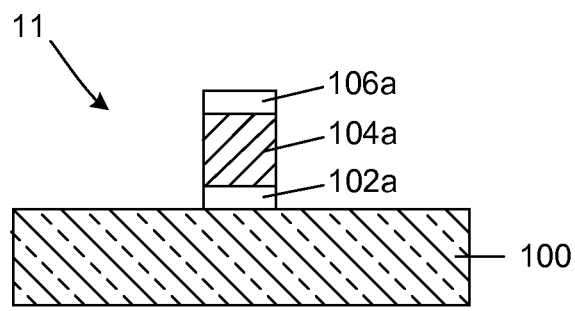

Once the patterning of the photoresist is completed, the sections covered by the photoresist are protected, while the exposed regions are removed using a selective etching process that removes the unprotected regions of the gate cap layer 106 forming a gate cap 106a. Following the formation of a gate cap 106a, the film structure 10 is then etched by a directional etch process, such as reactive ion etching, having high selectivity for removing the material of the gate conductor layer 104 to form the gate conductor 104a and removing the material of the gate dielectric layer 102 to form the gate dielectric 102a without substantially etching the patterned gate cap 106a and the substrate 100. The resulting structure 11 is shown in FIG. 1B.

Figure 1C:
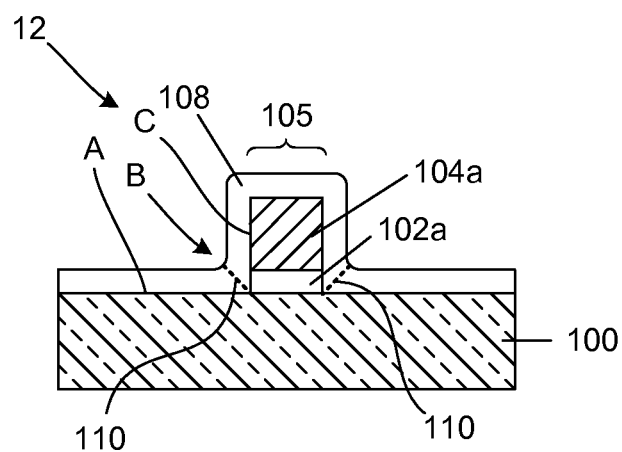

The gate cap 106a may then be removed using a chemical strip or etch process. FIG. 1C shows a structure 12 that contains a gate stack 105. The gate stack 105 includes the gate dielectric 102a and the gate conductor 104a positioned atop the gate dielectric 102a. According to an embodiment of the invention, a thin first spacer layer 108 is conformally deposited over the gate stack 105 and on the substrate 100 around the gate stack 105. A thickness of the deposited first spacer layer 108 may range from about 1 nm to about 20 nm, or from about 2 nm and 10 nm, for example about 3 nm.

The material of the first spacer layer 108 may be selected from nitrides, oxides, oxynitrides, and combinations thereof. Examples include nitrides, oxides, and oxynitrides of silicon. The first spacer layer 108 may be deposited by deposition process such as CVD, ALD, ALCVD, pulsed CVD, or PACVD. According to one embodiment, ALD SiN may be used to deposit a highly conformal first spacer layer 108.

The structure 12 contains a seam 110 in the conformal first spacer layer 108. The seam 110 is formed in an interface region B where two perpendicular surfaces A (vertical sidewall of gate stack 105) and C (horizontal surface of the substrate 100) meet. As depicted in FIG. 1C, the seam 110 propagates at an approximately 45 degree angle from the two perpendicular surfaces A and C. Such a seam 110 has been observed by transmission electron microscopy (TEM). It is contemplated that the seam 110 is formed due to interrupted film growth where the abrupt change in topography of the structure 12 occurs in the interface region B. The change in topography between surfaces A and C depicted in the interface region B in FIG. 1C is with an angle of approximately 90 degrees.

In another example, shown and described in FIGS. 2A-2E, a change in topography with an angle that is less than 90 degrees can be due to an undercut in the gate dielectric 102a. Such an undercut can further enhance the formation of the seam 110.

Still referring to FIG. 1C, the inventors have realized that the presence of the seam 110 in the first spacer layer 108 can be highly problematic to the integrity of the gate stack 105 and regions surrounding the gate stack 105. For example, the seam 110 breaches the seal of the gate stack 105 provided by the first spacer layer 108 and is a potential source of electrical leakage and contaminant transfer (e.g., oxygen diffusion) from the surrounding regions. Such contaminant transfer can affect the material and electrical properties of the gate stack 105. For example, a dielectric constant of the gate dielectric 102a and workfunction of the gate conductor 104a may be adversely affected by oxygen diffusion from the surrounding areas to the gate stack 105. Embodiments of the invention provide a method for breaking up a continuity of the seam 110 to reduce or prevent continuity of a path for contaminant transfer and reduce or prevent an electrical pathway through the seam 110.

FIG. 1D depicts a structure 13 containing a second spacer layer 130 conformally deposited on the first spacer layer 108 over the gate stack 105. The structure 13 depicted in FIG. 1D is further shown in the exploded view in FIG. 1E. The material of the second spacer layer 130 is different from the material of the first spacer layer 108 and is seam-free on the seam of the first spacer layer 108. The material of the second spacer layer 130 may be an amorphous material that breaks the continuity of the seam 110 of the first spacer layer 108.

According to some embodiments of the invention, the second material comprises amorphous silicon, poly silicon, an oxide of silicon, or an oxynitride of silicon, or a combination thereof. A thickness of the deposited second spacer layer 130 may range from about 0.5 nm to about 10 nm, or from about 1 nm and 5 nm, for example about 2 nm. For example, an amorphous silicon layer that is a few monolayers thick may be nucleated on the first spacer layer in order to break up further growth of the seam 110. The second material may include conformal silicon layer deposited by chemical vapor deposition (CVD) using a process gas containing a silicon-containing gas and optionally an inert gas. Other silicon-containing gases may be used for depositing the conformal Si layer, for example chlorosilanes, e.g., tetrachlorosilane ($SiCl_4$), trichlorosilane ($SiHCl_3$), dichlorosilane ($SiCl_2H_2$), chlorosilane ($SiH_3Cl$), and chlorodisilanes, e.g., hexachlorodisilane ($Si_2Cl_6$). Low gas pressure processing may be utilized, where process gas pressures are between about 1 mTorr and about 50 mTorr, or between about 50 mTorr and about 1 Torr. Alternately, process gas pressures may be higher than 1 Torr, for example higher than 10 Torr. In one example, an oxide of silicon may be deposited using TEOS (tetraethoxysilane).

FIG. 1F depicts a structure 14 containing a third spacer layer 132 deposited on the second spacer layer 130. A thickness of the deposited third spacer layer 108 may range from about 1 nm to about 20 nm, or from about 2 nm and 10 nm, for example about 3 nm. The material for the third spacer layer 132 may be selected from nitrides, oxides, oxynitrides, and combinations thereof. Examples include nitrides, oxides, and oxynitrides of silicon. The third spacer layer 132 may be deposited by deposition process such as CVD, ALD, ALCVD, pulsed CVD, or PACVD. According to one embodiment, ALD SiN may be used to deposit a highly conformal third spacer layer 132. According to some embodiments, a thickness of the second spacer layer 130 may less than a thickness of the first spacer layer 108, the third spacer layer 132, or both the first and third spacer layers 108, 132.

According to an embodiment of the invention, the material of the first spacer layer 108 and the material of the third spacer layer 132 may contain the same or similar material (e.g., nitrides, oxides, and oxynitrides of silicon). For example, the first and third spacer layers 108, 132 may contain or consist of silicon nitride ($Si_xN_y$, e.g., $Si_3N_4$, SiN, etc.). Further, the material of the second spacer layer 130 may contain a different material than the first spacer layer 108, the third spacer layer 132, or both the first and third spacer layers 108, 132. In one example, the first and third spacer layers 108, 132 may contain or consist of silicon nitride and the second spacer layer 130 may contain or consist of amorphous silicon, poly-silicon, silicon-rich (non-stoichiometric) silicon nitride, an oxide of silicon, or an oxynitride of silicon. The silicon or silicon-rich silicon nitride can act as an oxygen getter by forming $SiO_2$ or SiON, thereby preventing oxygen diffusion through the entire stack of spacer layers. In one example, the silicon or silicon-rich silicon nitride may be intentionally oxidized using a post-deposition anneal process and/or by exposure to air or other oxygen-containing atmosphere. Alternately or in addition to the above materials, in other examples, the first spacer layer 108, the second spacer layer 130, the third spacer layer 132, or two or more thereof, may contain SiCN, SiBN, or SiBCN, or a combination thereof.

According to one embodiment of the invention, the first and third spacer layers 108, 132 may contain or consist of silicon nitride, and the second spacer layer 130 may contain or consist of silicon-rich silicon nitride (e.g., 5-10% Si-rich). In one example, the silicon nitride may be deposited by CVD using simultaneous exposures of dichlorosilane (DCS) and ammonia ($NH_3$) and the silicon-rich silicon nitride may be formed by increasing the exposure of DCS relative to the exposure of $NH_3$. In another example, alternating layers of silicon nitride and silicon may be used. The silicon nitride may be deposited by ALD at a first substrate temperature using alternating exposures of DCS and $NH_3$, then raising the substrate temperature to a second substrate temperature suitable for CVD, depositing silicon-rich silicon nitride or silicon by CVD at the second substrate temperature, lowering the substrate temperature from the second substrate temperature to the first substrate temperature, and depositing silicon nitride by ALD at the first substrate temperature.

According to an embodiment of the invention, the first spacer layer 108, the second spacer layer 130, and the third spacer layer 132 may be dry etched using an anisotropic plasma etching process, for example a reactive ion etching (RIE) process. FIG. 1G shows a structure 15 with multilayer sidewall spacer layer that contains a first spacer 108a, a second spacer 130a, and a third spacer 132a.

The second spacer 130a is void of any seam on the first spacer 108a and the combination of the first spacer 108a, the second spacer 130a, and third spacer 132a provide a multi-layer sidewall spacer for seam protection of the gate stack 105, in which the discontinuation of the seam 110 by the second spacer 130a ensures that the gate conductor 104a is electrically isolated and contamination transfer to the gate stack 105 is prevented.

Figure 1H:
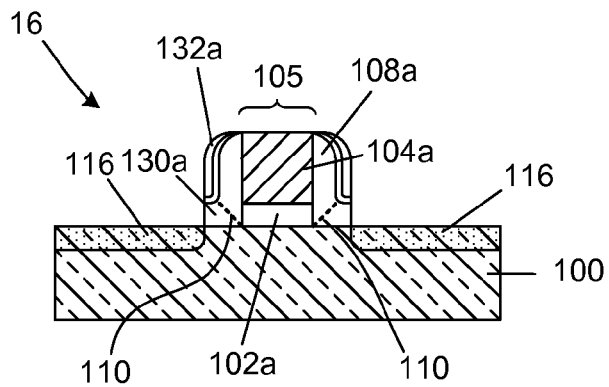

FIG. 1H depicts a structure 16 containing source and drain extension regions 116 formed in substrate 100. The source and drain extension regions 116 are formed via ion implantation and can comprise a combination of normally incident and optionally angled implants to form the desired grading in the dopant regions that may partially extend under the gate stack 105. PFET devices are produced within Si-containing substrates by doping the source and drain extension regions 116 with elements from Group V of the Periodic Table of Elements. NFET devices are produced within Si-containing substrates by doping the source and drain extension regions 116 with elements from Group III-A of the Periodic Table of Elements. Halo regions can also be formed beneath the source and drain extension regions 116 using an angled ion implantation and a dopant having a conductivity type opposite the source and drain extension regions 116.

Following formation of the source and drain extension regions 116, the source and drain extension regions 116 and the gate stack 105 are activated by activation annealing using a conventional process such as, but not limited to: rapid thermal annealing, furnace annealing, flash lamp annealing or laser annealing. Activation anneal may, for example, be conducted at a temperature ranging from about 850° C. to about 1350° C.

Figure 1I:
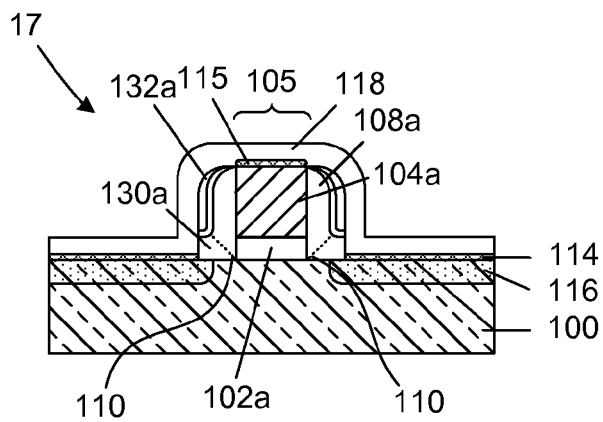

FIG. 1I depicts silicide regions 114,115 formed atop the source and drain extension regions 116 and the gate stack 105. Silicide formation typically requires depositing a metal layer onto the surface of a Si-containing material or wafer. The metal layer may be formed using a conventional process including, but not limited to: CVD, plasma-assisted CVD, high-density chemical vapor deposition (HDCVD), plating, sputtering, evaporation and chemical solution deposition. Metals deposited for silicide formation include Ta, Ti, W, Pt, Co, Ni, and combinations thereof, most preferably being Co or Ni. Following deposition, the structure is subjected to an annealing step using a conventional process such as, but not limited to: rapid thermal annealing. During annealing, the deposited metal reacts with Si forming a metal silicide.

Following silicidation, a conformal dielectric passivation film 118 is formed atop the gate stack 105 and the substrate 100. The conformal dielectric passivation film 118 may be selected from nitrides, oxides, oxynitrides, and combinations thereof. Examples include nitrides, oxides, and oxynitrides of silicon. The conformal dielectric passivation film 118 may be deposited by deposition process such as CVD, ALD, ALCVD, pulsed CVD, or PACVD. According to one embodiment, ALD SiN may be used to deposit the conformal dielectric passivation film 118.

Figure 1J:
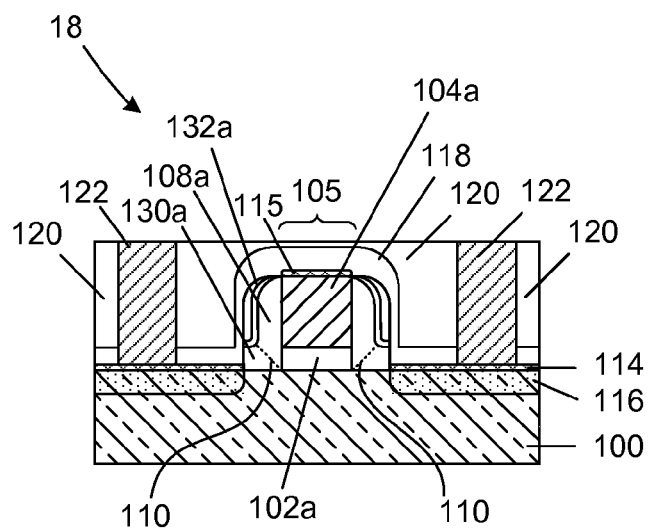

Following the formation of the conformal dielectric passivation film 118, the structure 17 depicted in FIG. 1I is further processed. The resulting structure 18 is depicted in FIG. 1J. The processing includes blanket depositing an interlayer dielectric 120 atop the structure 17 and performing a planarization process. The interlayer dielectric 120 may be selected from the group consisting of silicon-containing materials such as $SiO_2$, $Si_3N_4$, $SiO_xN_y$, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC, also known as amorphous hydrogenated carbon, a-C:H). Additional choices for the blanket dielectric include: any of the aforementioned materials in porous form, or in a form that changes during processing to or from being porous and/or permeable to being non-porous and/or non-permeable.

The interlayer dielectric 120 may be formed by various methods well known to those skilled in the art, including, but not limited to: spinning from solution, spraying from solution, chemical vapor deposition (CVD), plasma enhanced CVD (PECVD), sputter deposition, reactive sputter deposition, ion-beam deposition, and evaporation.

The interlayer dielectric 120 is then patterned and etched using conventional photolithography and etching to form vias to expose a portion of the conformal dielectric passivation film 118 overlying the silicide region 114. The silicide region is then exposed to an etch chemistry that removes the exposed portions of the conformal dielectric passivation film 118, without etching the interlayer dielectric 120 or the silicide region 114. Metal contacts 122 to the silicide region 114 are then formed by depositing a conductive metal into the via holes using conventional processing, such as sputtering or plating. The conductive metal may include, but is not limited to: tungsten, copper, aluminum, silver, gold, and alloys thereof.

Figure 2A:
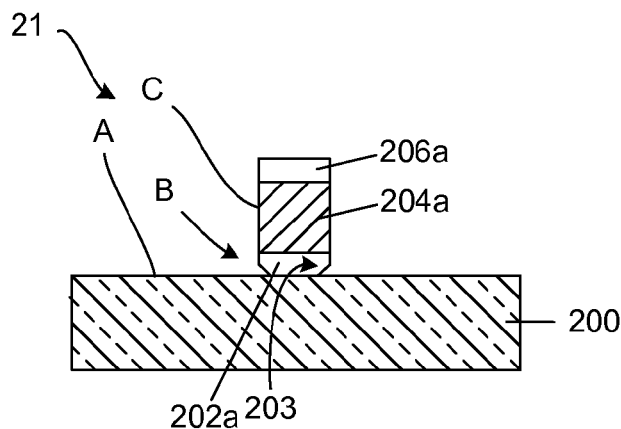
FIGS. 2A-2G are pictorial representations (through cross-sectional views) showing basic processing steps that may be employed to produce a semiconducting structure according to another embodiment of the invention.

FIGS. 2A-2G are pictorial representations (through cross-sectional views) showing basic processing steps that may be employed to produce a semiconducting structure according to another embodiment of the invention. The structure 21 in FIG. 2A is similar to the structure 11 in FIG. 1B and can contain the same or similar materials and layers as the structure 11. The structure 21 contains a gate cap 206a, a gate conductor 204a, and a gate dielectric 202a on substrate 200. The gate dielectric 202a depicted in FIG. 2A has an undercut 203 in the gate dielectric 202a in region B where surfaces A and C meet. The undercut 203 may be formed during a directional etch process, such as reactive ion etching, when forming the structure 21.

Figure 2B:
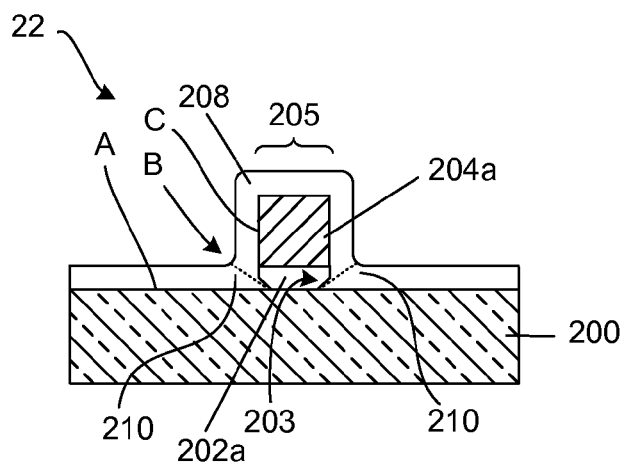

FIG. 2B schematically shows a structure 22 containing a seam 210 in a first spacer layer 208 deposited on gate stack 205. The seam 210 in the first spacer layer 208 can originate inside or near the undercut 203. As depicted in FIG. 2B, the seam 210 can propagate at an approximately 45 degree angle from inside the undercut 203 through a thickness of the first spacer layer 208. Embodiments of the invention provide a method for breaking up a continuity of the seam 210 to reduce or prevent continuity of a path for contaminant transfer and to prevent an electrical pathway through the seam 210. The first spacer layer 208 may be selected from nitrides, oxides, oxynitrides, and combinations thereof. Examples include nitrides, oxides, and oxynitrides of silicon. The first spacer layer 208 may be deposited by deposition process such as CVD, ALD, ALCVD, pulsed CVD, or PACVD. According to one embodiment, ALD silicon nitride may be used to deposit a highly conformal first spacer layer 208.

Figure 2C:
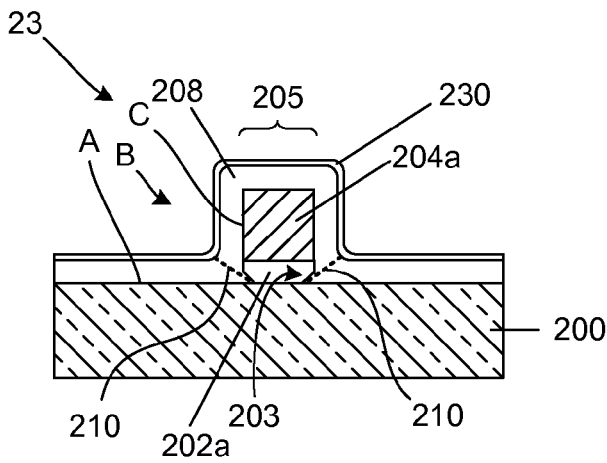
Figure 2D:
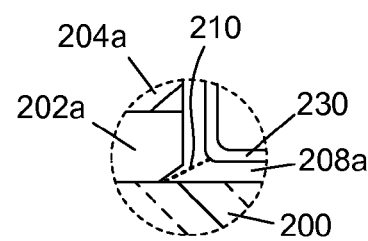

FIG. 2C depicts a structure 23 containing a second spacer layer 230 conformally deposited on the first spacer layer 208 over the gate stack 205. The structure 23 depicted in FIG. 2C is further shown in the exploded view in FIG. 2D. The material of the second spacer layer 230 is different from the material of the first spacer layer 208 and is seam-free on the seam of the first spacer layer 208. The material of the second spacer layer 230 may be an amorphous material the breaks the continuity of the seam 210 of the first spacer layer 208.

According to some embodiments of the invention, the second material comprises amorphous silicon, poly silicon, silicon-rich silicon nitride, an oxide of silicon, or an oxynitride of silicon, or a combination thereof. A thickness of the deposited second spacer layer 130 may range from about 0.5 nm to about 10 nm, or from about 1 nm and 5 nm, for example about 2 nm. For example, an amorphous silicon layer that is a few monolayers thick may be nucleated on the first spacer layer in order to break up further growth of the seam 210.

Figure 2E:
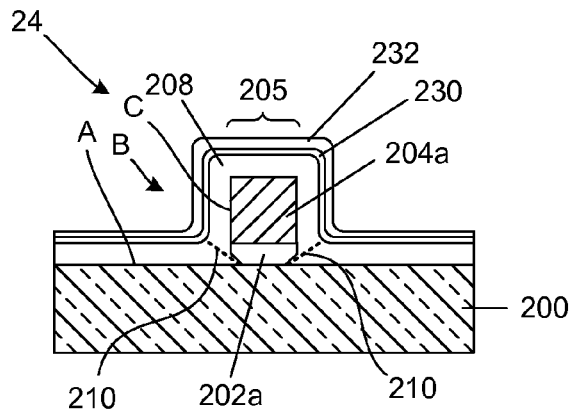

FIG. 2E depicts a structure 24 containing a third spacer layer 232 deposited on the second spacer layer 230. A thickness of the deposited third spacer layer 232 may range from about 1 nm to about 20 nm, or from about 2 nm and 10 nm, for example about 3 nm. The material for the third spacer layer 232 may be selected from nitrides, oxides, oxynitrides, and combinations thereof. Examples include nitrides, oxides, and oxynitrides of silicon. The third spacer layer 232 may be deposited by deposition process such as CVD, ALD, ALCVD, pulsed CVD, or PACVD. According to one embodiment, ALD SiN may be used to deposit a highly conformal third spacer layer 232. According to some embodiments, a thickness of the second spacer layer 230 may be less than a thickness of the first spacer layer 208, the third spacer layer 232, or both the first and third spacer layers 208, 232.

According to an embodiment of the invention, the material of the first spacer layer 208 and the material of the third spacer layer 232 may contain the same or similar material (e.g., nitrides, oxides, and oxynitrides of silicon). For example, the first and third spacer layers 208, 232 may contain or consist of silicon nitride ($Si_xN_y$, e.g., $Si_3N_5$, SiN, etc.). Further, the material of the second spacer layer 230 may contain a different material than the first spacer layer 208, the third spacer layer 232, or both the first and third spacer layers 208, 232. In one example, the first and third spacer layers 208, 232 may contain or consist of silicon nitride and the second spacer layer 230 may contain or consist of amorphous silicon, poly silicon, silicon-rich silicon nitride, an oxide of silicon, or an oxynitride of silicon. Alternately or in addition to the above materials, in other examples, the first spacer layer 208, the second spacer layer 230, the third spacer layer 232, or a combination of two or more thereof, may contain SiCN, SiBN, or SiBCN, or a combination thereof.

Figure 2F:
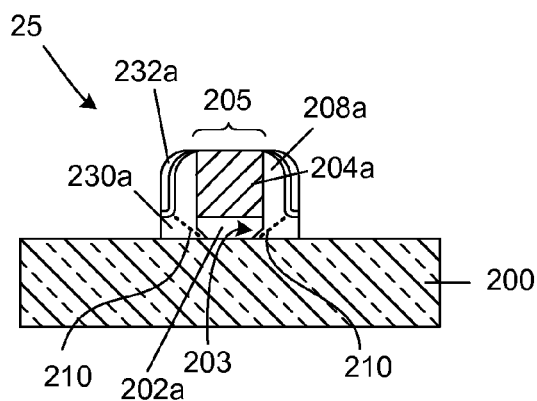

According to an embodiment of the invention, the first spacer layer 208, the second spacer layer 230, and the third spacer layer 232 may be dry etched using an anisotropic plasma etching process, for example a reactive ion etching (RIE) process. FIG. 2F shows a structure 25 with multilayer sidewall spacer layer that contains a first spacer 208a, a second spacer 230a, and a third spacer 232a.

Figure 2G:
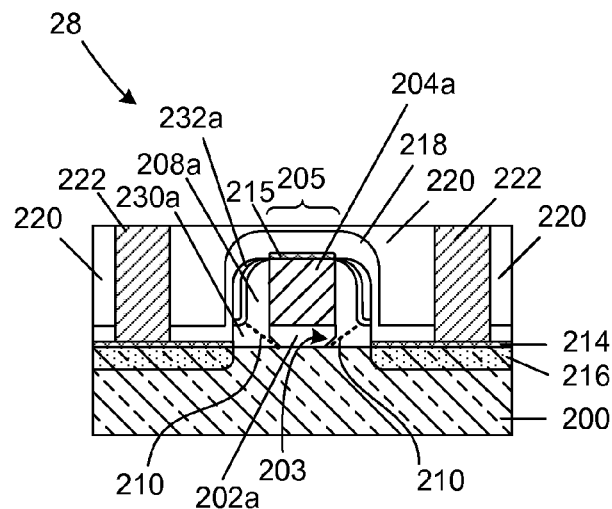

Referring now to FIG. 2G, the structure 28 is similar to the structure 18 of FIG. 1J and may be formed using the same or similar steps as described in FIGS. 1I-1J. The structure 28 contains, source and drain extension regions 216, silicide regions 214,215, conformal dielectric passivation film 218, interlayer dielectric 220, and metal contacts 222.

Figure 3A:
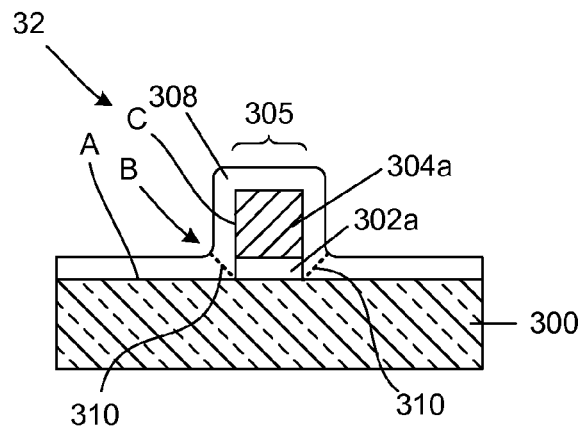
FIGS. 3A-3C are pictorial representations (through cross-sectional views) showing basic processing steps that may be employed to produce a semiconducting structure according to yet another embodiment of the invention.
Figure 3B:
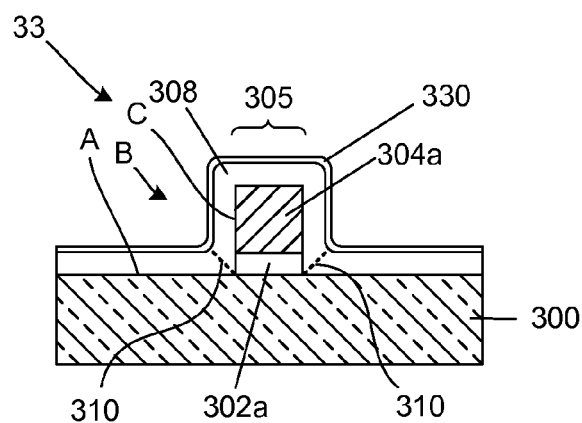
Figure 3C:
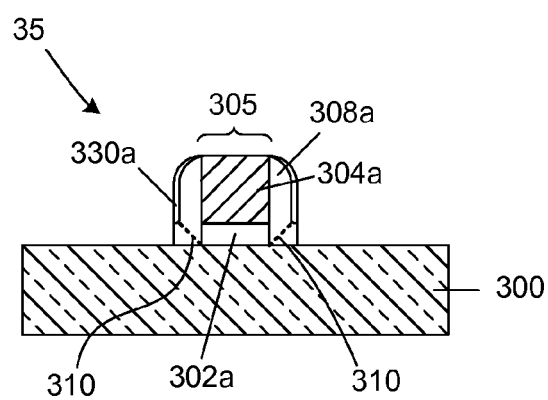

FIGS. 3A-3C are pictorial representations (through cross-sectional views) showing basic processing steps that may be employed to produce a semiconducting structure according to yet another embodiment of the invention. The structure 32 in FIG. 3A is similar to the structure 12 in FIG. 1C and can contain the same or similar materials and layers as the structure 12. The structure 32 contains a gate conductor 304a and a gate dielectric 302a on substrate 300. The structure 32 further contains a seam 310 in a first spacer layer 308 deposited on gate stack 305. The seam 310 is formed in an interface region B where two perpendicular surfaces A and C meet. The material of the first spacer layer 308 may be selected from nitrides, oxides, oxynitrides, and combinations thereof. Examples include nitrides, oxides, and oxynitrides of silicon. The first spacer layer 308 may be deposited by deposition process such as CVD, ALD, ALCVD, pulsed CVD, or PACVD. According to one embodiment, ALD silicon nitride may be used to deposit a highly conformal first spacer layer 308.

FIG. 3B depicts a structure 33 containing a second spacer layer 330 conformally deposited on the first spacer layer 308 over the gate stack 305.

According to one embodiment, the material of the second spacer layer 330 may be different from the material of the first spacer layer 308, and the second spacer layer 330 is seam-free on the seam 310 of the first spacer layer 308. The material of the second spacer layer 330 may be an amorphous material that breaks the continuity of the seam 310 of the first spacer layer 308. According to some embodiments of the invention, the material of the second spacer layer comprises amorphous silicon, poly silicon, silicon-rich silicon nitride, an oxide of silicon, or an oxynitride of silicon, or a combination thereof. A thickness of the deposited second spacer layer 330 may range from about 0.5 nm to about 10 nm, or from about 1 nm and 5 nm, for example about 2 nm. For example, an amorphous silicon layer that is a few monolayers thick may be nucleated on the first spacer layer 308 in order to break up further growth of the seam 310.

According to another embodiment, the material of the first spacer layer 308 and the material of the second spacer layer 330 can contain the same chemical elements. For example, the first and second spacer layers can contain silicon nitride ($Si_xN_y$, e.g., $Si_3N_5$, SiN, etc.) with different nitrogen to silicon ratios, different microstructures, or both. Alternately or in addition to the above materials, in other examples, the first spacer layer 308, the second spacer layer 330, or both, may contain SiCN, SiBN, or SiBCN, or a combination thereof. In one example, the first spacer layer 308 may be deposited at a first substrate temperature and the second spacer layer may be deposited at a second substrate temperature that is different from the first substrate temperature, and the depositing steps can be performed in any order.

The first spacer layer 308 and the second spacer layer 330 may be dry etched using an anisotropic plasma etching process, for example a reactive ion etching (RIE) process. FIG. 3C shows a structure 35 that has a multilayer sidewall spacer that contains a first spacer 308a and a second spacer 330a. The structure 35 may be further processed as described above in FIGS. 1I-1J.

Figure 4A:
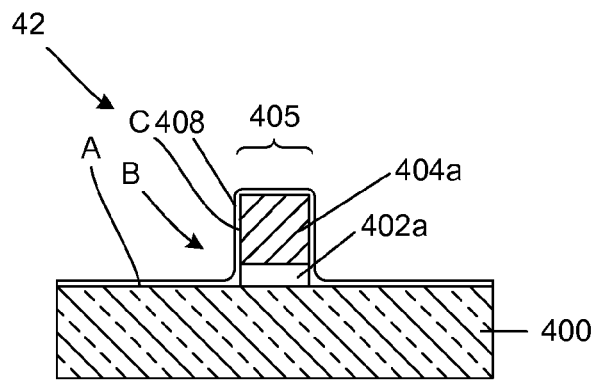
FIGS. 4A-4C are pictorial representations (through cross-sectional views) showing basic processing steps that may be employed to produce a semiconducting structure according to still another embodiment of the invention.
Figure 4B:
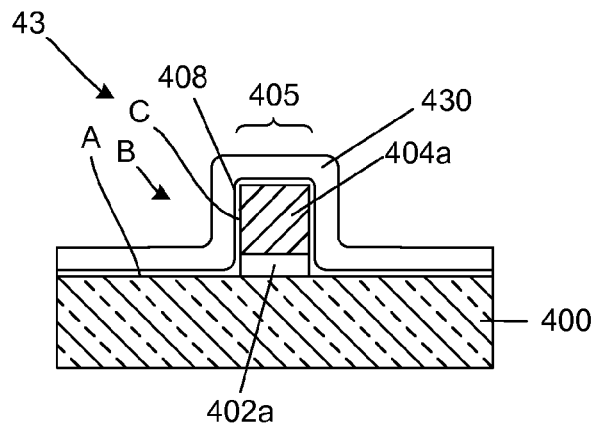
Figure 4C:
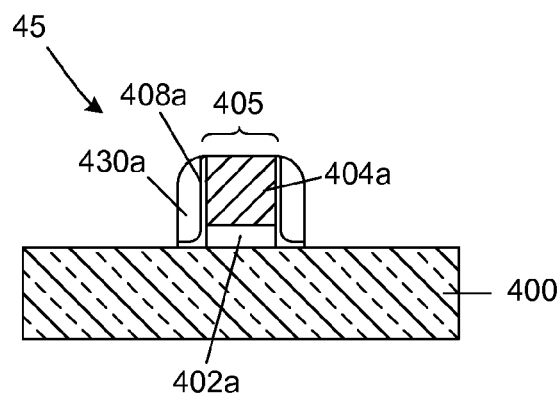

FIGS. 4A-4C are pictorial representations (through cross-sectional views) showing basic processing steps that may be employed to produce a semiconducting structure according to still another embodiment of the invention.

The structure 42 in FIG. 4A is similar to the structure 32 in FIG. 3A and can contain the same or similar materials and layers as the structure 32. The structure 42 contains a gate conductor 404a and a gate dielectric 402a on substrate 400. However, the first spacer layer 408 deposited on gate stack 405 is seam-free in the interface region B where two perpendicular surfaces A and C meet. The material of the first spacer layer 408 may be selected from nitrides, oxides, oxynitrides, and combinations thereof. Examples include nitrides, oxides, and oxynitrides of silicon. The first spacer layer 408 may be deposited by deposition process such as CVD, ALD, ALCVD, pulsed CVD, or PACVD. According to one embodiment, ALD silicon nitride may be used to deposit a highly conformal first spacer layer 408.

FIG. 4B depicts a structure 43 containing a second spacer layer 430 conformally deposited on the first spacer layer 408 over the gate stack 405.

According to one embodiment, the material of the second spacer layer 430 may be different from the material of the first spacer layer 408. According to some embodiments of the invention, the material of the second spacer layer 430 comprises amorphous silicon, poly silicon, silicon-rich silicon nitride, an oxide of silicon, or an oxynitride of silicon, or a combination thereof. A thickness of the deposited second spacer layer 430 may range from about 0.5 nm to about 10 nm, or from about 1 nm and 5 nm, for example about 2 nm. For example, an amorphous silicon layer that is a few monolayers thick may be nucleated on the first spacer layer 408.

According to another embodiment, the material of the first spacer layer 408 and the material of the second spacer layer 430 can contain the same chemical elements. For example, the first and second spacer layers can contain silicon nitride ($Si_xN_y$, e.g., $Si_3N_5$, SiN, etc.) with different nitrogen to silicon ratios, different microstructures, or both. Alternately or in addition to the above materials, in other examples, the first spacer layer 408, the second spacer layer 430, or both, may contain SiCN, SiBN, or SiBCN, or a combination thereof. In one example, the first spacer layer 408 may be deposited at a first substrate temperature and the second spacer layer may be deposited at a second substrate temperature that is different from the first substrate temperature, and the depositing steps may be performed in any order.

In one example, the first and second spacer layers 408, 430 can contain silicon nitride and the first substrate temperature can be higher than the second substrate temperature. The current inventors have discovered that a silicon nitride first spacer layer 408 that is deposited at a first substrate temperature of 630° C., by ALD using alternating exposures of dichlorosilane and ammonia, is seam-free on the gate stack 405 as schematically depicted in FIG. 4A. In comparison, substrate temperatures of 400-500° C. resulted in a seam 310 in the first spacer layer 308 as depicted in FIG. 3A. In addition to being seam-free, it is contemplated that the first spacer layer 408 has lower stress than the first spacer layer 308. Furthermore, it is contemplated that deposition of the first spacers layers 308, 408 may proceed by different growth kinetics, for example ALD-like growth kinetics at the lower substrate temperature and CVD-like growth kinetics at the higher substrate temperature. In one example, the first substrate temperature can be higher than 600° C. and the second substrate temperature can be 600° C. or less. In another example, the first substrate temperature can be higher than 600° C. and the second substrate temperature can be between 400° C. and 500° C. This provides a means for reducing the thermal budget for the combined deposition of the first and second spacer layers 408, 430.

The first spacer layer 408 and the second spacer layer 430 may be dry etched using an anisotropic plasma etching process, for example a reactive ion etching (RIE) process. FIG. 4C shows a structure 45 that has a multilayer sidewall spacer that contains a first spacer 408a and a second spacer 430a. The structure 45 may be further processed as described above in FIGS. 1I-1J.

According to other embodiments, the patterned structures shown and described in FIGS. 3 and 4 may contain an undercut near the interface region with the surface of the substrate as described above in FIG. 2A. In one example, patterned structures shown and described in FIGS. 3 and 4 may contain a gate dielectric on the substrate, source and drain extension regions in the surface of the substrate adjacent the gate dielectric, and a gate conductor on the gate dielectric. The patterned structure may contain an undercut in the gate dielectric near the interface region with the surface of the substrate.

A plurality of embodiments for forming multilayer sidewall spacers for seam protection of patterned structures has been disclosed. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. For example, the term "on" as used herein (including in the claims) does not require that a film "on" a patterned structure is directly on and in immediate contact with the substrate; there may be a second film or other structure between the film and the patterned structure.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

The invention claimed is:

1. A method for forming a multilayer sidewall spacer over a patterned structure, comprising:
providing a substrate containing the patterned structure on a surface of the substrate, wherein the patterned structure contains an undercut near the interface region with the surface of the substrate, and wherein the surface of the substrate and the undercut in the patterned structure form an angle of less than 90 degrees;
depositing a first spacer layer over the patterned structure at a first substrate temperature;
depositing a second spacer layer over the patterned substrate at a second substrate temperature that is different from the first substrate temperature, wherein the first and second spacer layers contain the same chemical elements; and
etching the first and second spacer layers to form the multilayer sidewall spacer on the patterned structure.

2. The method of claim 1, wherein the first substrate temperature is higher than the second substrate temperature.

3. The method of claim 1, wherein the first and second spacer layer both contain silicon nitride.

4. The method of claim 3, wherein the first substrate temperature is higher than 600° C. and the second substrate temperature is 600° C. or less.

5. The method of claim 3, wherein the first substrate temperature is higher than 600° C. and the second substrate temperature is between 400° C. and 500° C.

6. The method of claim 1, wherein the first and second spacer layers contain silicon nitride with different nitrogen to silicon ratios, different microstructures, or both.

7. A method for forming a multilayer sidewall spacer over a patterned structure, comprising:
providing a substrate containing the patterned structure on a surface of the substrate, wherein the patterned structure comprises a gate dielectric on the substrate, a source extension region and a drain extension region in the surface of the substrate adjacent the gate dielectric, and a gate conductor on the gate dielectric, and wherein the patterned structure contains an undercut in the gate dielectric near the interface region with the surface of the substrate;
depositing a first spacer layer over the patterned structure at a first substrate temperature;

depositing a second spacer layer over the patterned substrate at a second substrate temperature that is different from the first substrate temperature, wherein the first and second spacer layers contain the same chemical elements; and etching the first and second spacer layers to form the multilayer sidewall spacer on the patterned structure.

8. The method of claim 7, wherein the first substrate temperature is higher than the second substrate temperature.

9. The method of claim 7, wherein the first and second spacer layer both contain silicon nitride.

10. The method of claim 9, wherein the first substrate temperature is higher than 600° C. and the second substrate temperature is 600° C. or less.

11. The method of claim 9, wherein the first substrate temperature is higher than 600° C. and the second substrate temperature is between 400° C. and 500° C.

12. The method of claim 7, wherein the first and second spacer layers contain silicon nitride with different nitrogen to silicon ratios, different microstructures, or both.

* * * * *